US007487169B2

(12) United States Patent
Agarwal (10) Patent No.: US 7,487,169 B2
(45) Date of Patent: Feb. 3, 2009

(54) METHOD FOR FINDING THE LONGEST COMMON SUBSEQUENCES BETWEEN FILES WITH APPLICATIONS TO DIFFERENTIAL COMPRESSION

(75) Inventor: Ramesh Chandra Agarwal, Sararoga, CA (US)

(73) Assignee: International Business Machines Corporation, Armonk, NY (US)

( * ) Notice: Subject to any disclaimer, the term of this patent is extended or adjusted under 35 U.S.C. 154(b) by 732 days.

(21) Appl. No.: 10/904,732

(22) Filed: Nov. 24, 2004

(65) Prior Publication Data

US 2006/0112264 A1    May 25, 2006

(51) Int. Cl.
*G06F 7/00* (2006.01)
*G06F 17/00* (2006.01)
*G06F 12/00* (2006.01)
*G06F 17/30* (2006.01)

(52) U.S. Cl. ...................................... 707/101; 707/203
(58) Field of Classification Search ................. 707/101, 707/203; 713/176
See application file for complete search history.

(56) References Cited

U.S. PATENT DOCUMENTS

| 5,281,967 | A | | 1/1994 | Jung |
| 5,371,499 | A | | 12/1994 | Graybill et al. |
| 5,532,694 | A | | 7/1996 | Mayers et al. |
| 5,799,301 | A | | 8/1998 | Castelli et al. |
| 5,930,789 | A | | 7/1999 | Agrawal et al. |
| 5,946,692 | A | * | 8/1999 | Faloutsos et al. ............ 707/101 |
| 6,119,120 | A | | 9/2000 | Miller |
| 6,226,634 | B1 | * | 5/2001 | Ogihara et al. ................. 707/4 |
| 6,359,574 | B1 | | 3/2002 | Yariv |
| 6,374,250 | B2 | * | 4/2002 | Ajtai et al. ................... 707/101 |
| 6,392,567 | B2 | | 5/2002 | Satoh |
| 6,553,372 | B1 | * | 4/2003 | Brassell et al. ................. 707/5 |
| 6,611,832 | B1 | | 8/2003 | Van Lunteren |
| 6,697,810 | B2 | * | 2/2004 | Kumar et al. ................. 707/10 |
| 6,738,762 | B1 | | 5/2004 | Chen et al. |
| 6,792,423 | B1 | | 9/2004 | Jeffries et al. |
| 7,353,225 | B2 | * | 4/2008 | Dada ............................. 707/6 |
| 2002/0010702 | A1 | * | 1/2002 | Ajtai et al. ................... 707/101 |
| 2002/0152219 | A1 | | 10/2002 | Singh |

(Continued)

OTHER PUBLICATIONS

R.C. Burns et al., "Efficient distributed backup with delta compression", Proc. of the Fifth Workshop on I/O in Paralle and Dist. Syst., Nov. 1997.

(Continued)

*Primary Examiner*—Wilson Lee
*Assistant Examiner*—Patrick A Darno
(74) *Attorney, Agent, or Firm*—Marc D. McSwain (57) ABSTRACT

A differential compression method and computer program product combines hash value techniques and suffix array techniques. The invention finds the best matches for every offset of the version file, with respect to a certain granularity and above a certain length threshold. The invention has two variations depending on block size choice. If the block size is kept fixed, the compression performance of the invention is similar to that of the greedy algorithm, without the expensive space and time requirements. If the block size is varied linearly with the reference file size, the invention can run in linear-time and constant-space. It has been shown empirically that the invention performs better than certain known differential compression algorithms in terms of compression and speed.

1 Claim, 8 Drawing Sheets

U.S. PATENT DOCUMENTS

| | | | |
|---|---|---|---|
| 2002/0161860 A1 | 10/2002 | Godlin et al. | |
| 2003/0030575 A1 | 2/2003 | Frachtenberg et al. | |
| 2003/0120647 A1* | 6/2003 | Aiken et al. | 707/3 |
| 2003/0187856 A1 | 10/2003 | Luk et al. | |
| 2003/0212712 A1 | 11/2003 | Gu et al. | |
| 2004/0148506 A1* | 7/2004 | Prince | 713/176 |

OTHER PUBLICATIONS

R.A. Wagner et al., "The string-to-string correction problem", Journal of the Association for Computing Machinery, vol. 21, No. 1, Jan. 1974, pp. 168-173.

W. Miller et al., "A file comparison program", Software-Practice and Experience. vol. 15, Nov. 1985, pp. 1025-1040.

C. Reichenberger, "Delta storgae for arbitrary non-text files", Proc. of the 3rd Int'l. Workshop on Software Configuration Management, Norway, Jun. 1991, ACM pp. 144-152.

J.J. Hunt et al., "Delta algorithms: An empirical analysis", ACM Trans. on Software Eng. and Meth., vol. 7, No. 2, 1998, pp. 192-214.

J. P. MacDonald, "Versioned file archiving, compression, and distribution", U.C. Berkeley, 1998.

M. Ajtai et al., "Compactly encoding unstructured inputs with differential compression", Journal of ACM, vol. 49, No. 3, May 2002, pp. 318-367.

J. Ziv et al., "A universal algorithm for sequential data compression", IEEE Transactions on Information Theory, vol. 23, No. 3, May 1977, pp. 337-343.

W.F. Tichy, "The string-to-string correction problem with block moves", ACM Transactions on Computer Systems, vol. 2, No. 4, 1984, pp. 309-321.

J.P. Mac Donald, "File System Support for Delta Compression", Masters Thesis at the University of California, Berkeley, 2000. Available at http://www.xcf.berkeley.edu/jmacd/.

P. Weiner, "Linear pattern matching algorithms", Proc. of the 14th Annual IEEE Symposium on Switching and Automata Theory. IEEE Computer Society Press, Los Alamitos, Calif., Oct. 15-17, 1973, pp. 1-11.

U. Manber et al., "Suffix arrays: A New Method for On-Line String Searches", First annual ACM-SIAM Symposium on Discrete Algorithms (SODA), Jan. 1990, pp. 319-327.

Shapira et al., "In Place Differential File Compression", Proc. of the Data Compression Conference (DCC), 2003, pp. 1-10.

R.M. Karp et al., "Efficient randomized pattern-matching algorithms", IBM Journal of Research and Development, vol. 31, No. 2, Mar. 1987, pp. 249-260.

R. Agarwal et al., "An approximation to the greedy algorithm for differential compression", Jan. 2004.

S. Rao Kosaraju, "Real-time pattern matching and quasi-real-time construction of suffix trees", Proc. of the 28th Annual ACM Symp. on Theory of Comp. (STOC), ACM 1994, Montreal, Quebec, Canada, May 23-25, 1994, pp. 310-316.

M. Farach et al., "Perfect hashing for strings: Formalization and algorithms", Proc. of the 7th annual symposium on combinatorial Pattern Matching, 1996.

B. Bollobas et al., "Time-series similarity problems and well-separated geometric sets", Proc. of the 13th Annual Symposium on Comp. Geometry (SGC), 1997, pp. 454-457.

N. Yazdani et al., "Sequence matching of images", Proc. of the 8th Conf. on Scientific and Statistical Database Management (SSDBM), 1996, pp. 53-63.

* cited by examiner

BEST-MATCH-ALGORITHM

INPUT:
HASH VALUE $H(v_c)$ THAT THE INVENTION SEEKS TO MATCH

OUTPUT:
THE BEST MATCH FOR THE INPUT HASH VALUE $H(v_c)$ IF IT EXISTS AND A NULL VALUE OTHERWISE

1. IF (THE CORRESPONDING ENTRY TO $H(v_c)$ IN THE QUICK INDEX ARRAY IS 0)

(a) RETURN A NULL VALUE SINCE $H(v_c)$ IS NOT IN THE HASH TABLE

2. ELSE

(a) USE THE CORRESPONDING ENTRY IN THE POINTER ARRAY TO GET A HASH VALUE IN THE BLOCK HASH TABLE     (b) IF (THE HASH VALUE IN THE BLOCK HASH TABLE > $H(v_c)$)
        i. RETURN A NULL VALUE SINCE $H(v_c)$ IS NOT IN THE TABLE     (c) ELSE
        i. SEQUENTIALLY PROCESS THE VALUES IN THE BLOCK HASH TABLE UNTIL AN ENTRY EQUAL TO $H(v_c)$ IS FOUND OR THE FIRST ENTRY THAT IS LARGER THAN $H(v_c)$ IS FOUND
        ii. IF THE LATTER CASE IS TRUE
            - RETURN A NULL VALUE BECAUSE $H(v_c)$ IS NOT IN THE TABLE
        iii. ELSE (MATCH IS FOUND)
            - IF THE MATCH IS UNIQUE, INDICATED BY THE LEADING BIT OF THE 32-BIT HASH VALUE
                - RETURN THE MATCH
            - ELSE (THE MATCH IS NOT UNIQUE)
                - PERFORM BINARY-SEARCH-FOR-SUFFIXES TO FIND THE LONGEST MATCH WHERE THE INITIAL RANGE IS COUNT NUMBER OF VALUES
            - RETURN THE LONGEST MATCH

FIG. 3

DIFFERENTIAL-COMPRESSION-ALGORITHM

INPUT:
REFERENCE FILE STRING, VERSION FILE STRING 1. (a) INITIALIZE $r_c = 0$.
   (b) WHILE ($r_c < m-p$)
      i. COMPUTE $H(r_c)$ AND STORE IN THE HASH VALUE ARRAY
      ii. INCREMENT $r_c$ BY p
2. CALL SUFFIX-ARRAY-CONSTRUCTION WITH HASH VALUE ARRAY AS INPUT
3. IN A SINGLE PASS OF THE SUFFIX ARRAY, CREATE THE QUICK INDEX ARRAY, THE POINTER ARRAY, AND THE BLOCK HASH TABLE
4. INITIALIZE $v_c = 0$ AND $v_{prev} = 0$.
5. WHILE ($v_c < n-p$)
   (a) INITIALIZE BEST-SEEN-MATCH TO NULL
   (b) COMPUTE $H(v_c)$
   (c) CALL BEST-MATCH-ALGORITHM WITH $H(v_c)$ AS INPUT
   (d) IF MATCHING ALGORITHM RETURNS NULL
      i. INCREMENT POINTER $v_c$ BY 1
   (e) ELSE (MATCH IS FOUND)
      i. STORE MATCH IN THE BEST-SEEN-MATCH VARIABLE
      ii. $v_{temp} = v_c$
      iii. FOR ($v_c = v_{temp}+1$ TO $v_c = v_{temp}+p-1$)
         - COMPUTE $H(v_c)$ AND CALL THE BEST-MATCH-ALGORITHM WITH $H(v_c)$ AS INPUT
         - IF MATCHING ALGORITHM RETURNS A MATCH AND IS LONGER THAN THE BEST-SEEN-MATCH
            - UPDATE THE BEST-SEEN-MATCH VARIABLE TO CONTAIN THE CURRENT MATCH
      iv. CHECK THE VALIDITY OF THE BEST-SEEN-MATCH AND EXTEND IT AS FAR LEFT AND RIGHT AS POSSIBLE AND FINALLY ENCODE THE MATCH AS A COPY COMMAND THE MATCH AS A COPY COMMAND
      v. ENCODE THE INFORMATION STARTING AT $v_{prev}$ TO THE START OF THE MATCH AS AN INSERT COMMAND
      vi. UPDATE THE $v_c$ AND $v_{prev}$ POINTERS TO THE END OF THE MATCH
6. ENCODE THE LAST BIT OF INFORMATION FROM $v_{prev}$ TO THE END OF THE FILE AS AN INSERT COMMAND POSTCONDITION:
DELTA ENCODING WITH COPY AND INSERT COMMANDS AND NEW INFORMATION TO BE ENCODED

FIG. 4

BINARY-SEARCH-FOR-SUFFIXES

PRECONDITION:
THERE IS A LARGE RANGE OF SUFFIXES THAT MATCH THE VERSION HASH FILE VALUE STRING IN THE FIRST BLOCK. LET THE FIRST BLOCK OF THE VERSION FILE HASH VALUE BE $H(v_c)$.

1. INITIALIZE lowRankPtr TO POINT TO THE LEXICOGRAPHICALLY LOWEST REFERENCE FILE HASH SUBSTRING STARTING WITH $H(v_c)$ (THE FIRST PAIR OF VALUES AFTER $H(v_c)$ AND ITS COUNT, THIS IS THE ROW CONTAINING ptr2 IN THE EXAMPLE GIVEN IN FIGURE 2) AND highRankPtr TO POINT TO THE LEXICOGRAPHICALLY HIGHEST REFERENCE FILE HASH SUBSTRING STARTING WITH $H(v_c)$ (COUNT PAIR OF VALUES AFTER $H(v_c)$ AND ITS COUNT, THIS IS THE ROW CONTAINING ptr6 IN THE EXAMPLE GIVEN IN FIGURE 2). LET w BE THE STRING OF HASH VALUES TO BE MATCHED.

2. WHILE (highRankPtr-lowRankPtr>1)

(a) midRankPtr = (highRankPtr+lowRankPtr)/2

(b) Ptr <- THE POINTER STORED IN THE ODD LOCATION OF THE midRankPtr ROW OF THE BLOCK HASH TABLE (c) IF THE STRING OF HASH VALUES STARTING AT HASH VALUE array[Ptr]>w THEN
      i. highRankPtr = midRankPtr (d) ELSE
      i. lowRankPtr = midRankPtr 3. COMPARE |lcp(low, w)| AND |lcp(w, high)| WHERE LOW IS THE STRING IN THE HASH VALUE ARRAY CORRESPONDING TO lowRankPtr AND HIGH IS THE STRING IN THE HASH VALUE ARRAY CORRESPONDING TO highRankPtr TO FIND WHETHER LOW OR HIGH IS THE LONGER MATCH

4. RETURN THE LONGER OF THE MATCHES FROM THE PREVIOUS STEP

POSTCONDITION:
THERE IS A SINGLE SUFFIX THAT MATCHES THE VERSION FILE HASH VALUE STRING IN THE MAXIMUM NUMBER OF BLOCKS

FIG. 5

FOUR-BYTE-INTEGER-SORT

INPUT:
AN ARRAY (THE PRIMARY ARRAY) WITH HASH VALUES IN THE EVEN LOCATIONS AND THE CORRESPONDING POINTERS TO THE HASH VALUE ARRAY IN THE ODD LOCATIONS

1. CONSTRUCT THE FOUR COUNT ARRAYS, ONE FOR EACH BYTE POSITION TO BE SORTED. IN THE FIRST PASS, COUNT THE NUMBER OF OCCURRENCES OF EACH BYTE VALUE, WHICH WILL BE ANYWHERE FROM 0 TO 255. FOUR ARRAYS ARE CREATED WITH 256 VALUES EACH THAT CONTAIN THE NUMBER OF OCCURRENCES OF EACH BYTE VALUE. THIS STEP TAKES O(L) TIME. THE LOWEST ORDER BYTE IS BYTE 1, THE NEXT BYTE 2, ETC.; THE HIGHEST ORDER BYTE IS BYTE 4.

2. SEQUENTIALLY PROCESS THE PRIMARY ARRAY AND COPY VALUES INTO THE WORK ARRAY USING THE COUNT ARRAY. THE COUNT ARRAY FOR BYTE 1 TELLS EXACTLY WHERE EACH HASH VALUE (ALONG WITH ITS INDEX IN THE HASH VALUE ARRAY STORED IN THE ODD LOCATION) SHOULD BE PLACED WHEN SORTING ON THE LOWEST ORDER BYTE. AFTER COMPLETION OF THIS STEP, THE WORK ARRAY IS SORTED ON THE LOWEST ORDER BYTE OF HASH VALUES BY THEOREM A.1. THIS STEP TAKES O(L) TIME.

3. SORT ON THE NEXT LOW ORDER BYTE (BYTE 2), USING THE ARRAY WORK ARRAY AND THE COUNT ARRAY FOR BYTE 2. SEQUENTIALLY PROCESS THE WORK ARRAY AND PLACE THE HASH VALUES (WITH THEIR INDICES IN THE ODD LOCATIONS) IN THEIR CORRECT PLACES IN THE PRIMARY ARRAY. USE THE COUNT ARRAY WHICH TELLS WHERE THE HASH VALUES SHOULD GO. AT THE COMPLETION OF THIS STEP, THE PRIMARY ARRAY HAS THE HASH VALUES SORTED ON THE LAST TWO BYTES BY THEOREM A.1. THIS STEP TAKES O(L) TIME.

4. SORT BASED ON THE NEXT LOW ORDER BYTE. SEQUENTIALLY PROCESS THE PRIMARY ARRAY AND EACH HASH VALUE IS STORED IN ITS CORRECT LOCATION USING THE COUNT ARRAY FOR BYTE 3. AT THE CONCLUSION OF THIS STEP, THE WORK ARRAY HAS THE HASH VALUES SORTED ON THE LAST THREE BYTES BY THEOREM A.1. THIS STEP TAKES O(L) TIME.

5. SORT BASED ON THE HIGHEST ORDER BYTE AS DESCRIBED IN STEP 3. AT THE CONCLUSION OF THIS STEP, THE PRIMARY ARRAY HAS THE HASH VALUES SORTED ON ALL FOUR BYTES BY THEOREM A.1. THIS STEP TAKES O(L) TIME.

OUTPUT:
ARRAY WITH SORTED HASH VALUES STORED IN EVEN LOCATIONS AND THE CORRESPONDING POINTERS TO THE HASH VALUE ARRAY IN ODD LOCATIONS.

FIG. 6

SUFFIX-ARRAY-CONSTRUCTION

INPUT:
ARRAY WITH HASH VALUES IN THE EVEN LOCATIONS AND CORRESPONDING POINTERS IN THE ODD LOCATIONS

1. PERFORM FOUR-BYTE-INTEGER-SORT ON THE HASH VALUES. AT THE END OF THIS STEP, THE SORTED HASH VALUES ARE STORED IN EVEN LOCATIONS OF THE ARRAY. THE CORRESPONDING POINTERS IN THE ODD LOCATIONS HAVE BEEN MOVED WITH THE HASH VALUES AS THEY WERE SORTED, THUS EACH HASH VALUE IS STILL ADJACENT TO ITS POINTER. THIS IS THE PRELIMINARY SUFFIX ARRAY.

2. IF ALL HASH VALUES ARE DISTINCT, THE HASH VALUES ARE SORTED. IF THE HASH VALUES ARE NOT DISTINCT, THEN CONSTRUCT AND INITIALLY POPULATE THE RANK ARRAY. THE RANK ARRAY IS INITIALLY POPULATED BY A SINGLE SCAN ON THE PRELIMINARY SUFFIX ARRAY. IF A HASH VALUE IS UNIQUE, THEN IT HAS A UNIQUE RANK VALUE. HOWEVER IF THE HASH VALUE IS NOT UNIQUE, THEN ALL IDENTICAL HASH VALUES SHARE THE SAME RANK. NOW DEFINE A GROUP TO BE THE SET OF IDENTICAL HASH VALUES. NOTE THAT EACH GROUP SHARES THE SAME RANK.

3. INITIALIZE THE DEPTH OF SORTING VARIABLE TO 1.

4. FOR (EACH GROUP):
(a) SORT ON THE RANKS CORRESPONDING TO THE LOCATION THAT IS EQUAL TO THE CURRENT LOCATION PLUS THE DEPTH OF SORTING. THESE RANKS ARE OBTAINED FROM THE RANK ARRAY. THE SORTING IS DONE USING THE FOUR-BYTE-INTEGER-SORT ALGORITHM.
(b) UPDATE THE RANKS IN THE RANK ARRAY.

5. AT THE CONCLUSION OF STEP 4, THE HASH VALUES ARE NOW SORTED AT TWICE THE DEPTH AS COMPARED WITH BEFORE STEP FOUR. THEREFORE, THE DEPTH OF SORTING VARIABLE IS DOUBLED.

6. IF THERE ARE STILL UNRESOLVED RANKS, GO TO STEP 4. OTHERWISE, EXIT.

OUTPUT:
SUFFIX ARRAY THAT CONTAINS THE INDICES CORRESPONDING TO THE SORTED SUFFIXES. STRING OF HASH VALUES STARTING AT SUFFIX[i] < STRING OF HASH VALUES STARTING AT SUFFIX[i+1] $\forall$ i

METHOD FOR FINDING THE LONGEST COMMON SUBSEQUENCES BETWEEN FILES WITH APPLICATIONS TO DIFFERENTIAL COMPRESSION

FIELD OF THE INVENTION

This invention relates to finding the longest common substrings between files, typically for performing differential file compression.

RELATED ART

The following articles are hereby incorporated in their entirety herein by reference:
[1] R. C. Burns and D. D. E. Long. Efficient distributed backup and restore with delta compression. Proceedings of the Fifth Workshop on I/O in Parallel and Distributed Systems, 1997.
[2] R. A. Wagner and M. J. Fischer. The string-to-string correction problem. Journal of the ACM. 1973.
[3] W. Miller and E. W. Myers. A file comparison program. Software-Practice and Experience. November 1985.
[4] C. Reichenberger. Delta storage for arbitrary non-text files. Proceedings of the $3^{rd}$ International Workshop on Software Configuration Management, 1991.
[5] J. J. Hunt, K.-P. Vo, and W. F. Tichy. Delta algorithms: An empirical analysis. ACM Transactions on Software Engineering and Methodology, 7(2), 1998.
[6] J. P. MacDonald. Versioned file archiving, compression, and distribution. UC Berkeley. Available via http://www.cs.berkeley.edu/jmacd/
[7] M. Ajtai, R. Burns, R. Fagin, D. D. E. Long, and L. Stockmeyer. Compactly encoding unstructured input with differential compression. Journal of the ACM 49(3), 318-367, 2002.
[8] J. Ziv and A. Lempel. A universal algorithm for sequential data compression. IEEE Transactions on Information Theory. 1977.
[9] W. F. Tichy. The string-to-string correction problem with block move. ACM Transactions on Computer Systems, 2(4), 1984.
[10] J. P. MacDonald. File System Support for Delta Compression. Master's Thesis at the University of California Berkeley. Available at http://www.xcf.berkeley.edu/jmacd/
[11] P. Weiner. Linear pattern matching algorithms. In Proceedings of the 14th Annual IEEE Symposium on Switching and Automata Theory. IEEE Computer Society Press, Los Alamitos, Calif., 1-11.
[12] U. Manber and E. W. Myers: Suffix Arrays: A New Method for On-Line String Searches. SIAM Journal of Computing. 22(5): 935-948 (1993)
[13] D. Shapira and J. Storer. In-Place Differential File Compression. Proceedings of the Data Compression Conference, 2003.
[14] R. M. Karp and M. O. Rabin. Efficient randomized pattern-matching algorithms. IBM Journal of Research and Development. 1987.

BACKGROUND OF THE INVENTION

Figure 1:
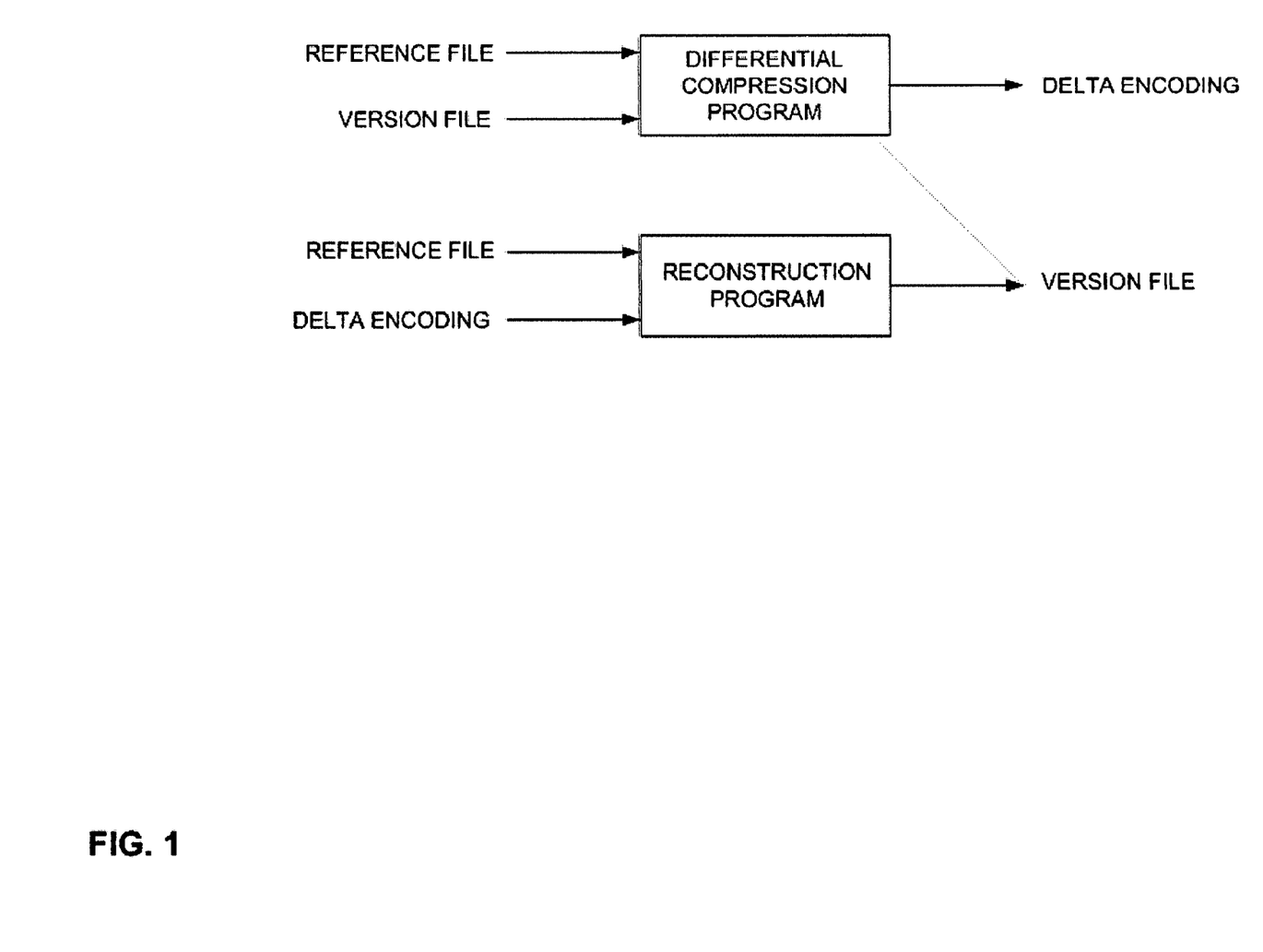
FIG. 1 is a diagram of the basic ideas of conventional differential compression.

Referring now to FIG. 1, an overview of differential compression is shown. Differential compression or delta compression is a way of compressing data with a great deal of similarities. Differential compression produces a delta encoding, a way of representing a version file in terms of an original file plus new information. Thus differential compression algorithms try to efficiently find common data between a reference and a version file to reduce the amount of new information which must be used. By storing the reference file and this delta encoding, the version file can be reconstructed when needed. Alternately, the reference file can be represented in terms of a version file, or each file can be represented as a set of changes of the subsequent version.

Early differential compression algorithms ran in quadratic time or made assumptions about the structure and alignment of the data to improve running time. However, many of the practical applications need differential compression algorithms that are scalable to large inputs and that make no assumptions about the structure or alignment of the data. The main uses of differential compression algorithms are in software distribution systems, web transportation infrastructure, and version control systems, including backups. In systems where there are multiple backup files, a great deal of storage space can be saved by representing each backup file as a set of changes of the original.

The advantages of differential compression are clear in terms of disk space and network transmission. Furthermore, when transmitting information, transmission costs are reduced since only changes need to be sent rather than the entire version file. In client/server backup and restore systems, network traffic is reduced between clients and the server by exchanging delta encodings rather than exchanging whole files[1]. Furthermore, the amount of storage required in a backup server is less than if one were to store the entire file. Software updates can be performed this way as well, which provides the added benefit of providing a level of piracy protection since the reference version is needed to reconstruct the version file. Thus software updates can be performed over the web, since the delta will be of very little use to those who do not have the original.

The differencing problem can be considered in terms of a single version file along with a reference file, or a number of version files along with a single reference file. This application describes the case of a single version file along with a single reference file for simplicity, but the invention can readily be extended to the case of a number of version files along with a single reference file.

Differential compression arose as part of the string to string correction problem[2], which essentially means finding the minimum cost of representing one string in terms of the other. The string to string correction problem goes hand in hand with the longest common subsequence (LCS) problem. Miller and Myers[3] presented a scheme based on dynamic programming and Reichenberger[4] presented a greedy algorithm to optimally solve the string to string correction problem. Both these algorithms ran in quadratic time and/or linear space, which proved to be undesirable for very large files.

The diff utility in UNIX is one of the most widely used differencing tools. However, it is undesirable for most differential compression tasks because it does not find many matching substrings between the reference and version files. Since it does line by line matching, it operates at a very high granularity, and when data becomes misaligned (due to the addition of a few characters as opposed to a few lines), diff fails to find the matching strings following the inserted characters.

There has been much work in the past few years in the area of the copy/insert class of delta algorithms. The present invention falls into this class of techniques, which use a string matching method to find matching substrings between the reference file and version file and then encode these substrings as copy commands, and which encode the new information as an insert command. vcdiff [5], xdelta[6], and the work of Ajtai et al.[7] also fall under the copy/insert class of delta algorithms. The benefit of using this type of method is that if a particular substring in the reference file has been copied to numerous locations in the version file, each copied substring can be encoded as a copy command. Also, if a contiguous part of the reference file substring has been deleted in the version file, the remaining part of the old substring can be represented as two copy commands. There is a benefit to representing the version file as copy commands versus insert commands: copy commands are compact in that they require only the reference file offset and the length of the match. Insert commands require the length as well as the entire new string to be added. Thus for a compact encoding, it is desirable to find the longest matches at every offset of the version file to reduce the number of insert commands and to increase the length of the copy command.

The present invention is compared empirically to those of vcdiff [5], xdelta[6], and the work of Ajtai et al.[7], which seem to be the most competitive differential compression algorithms currently available, in terms of both time and compression. Vcdiff runs in linear-time, while xdelta runs in linear-time and linear-space, although the constant of the linear-space is quite small. Ajtai et al.[7] presented a family of differential compression algorithms where one of their algorithms runs in provably constant-space and (shown empirically) runs in linear-time and offers good compression. However, in some situations, it produces suboptimal compression. They presented three more algorithms that cannot be proven to be linear-time, but produce better compression results.

Ajtai et al. described a greedy algorithm based on the work of Reichenberger[4]. They have used the greedy algorithm for comparison to their schemes and prove that this greedy algorithm provides an optimal encoding in a very simplified model. An optimal solution to the differencing problem depends on the model chosen to quantify the cost of representing the difference file. For a general cost measure, it can be solved in polynomial time by dynamic programming. The greedy algorithm operates by computing hash values on the reference file at every possible offset and storing all such values. Hash values are computed on blocks, where the block size is a predefined parameter. Hash collisions are dealt with by chaining the entries at each value. Next, the version file is continually processed. At each offset of the version file, the greedy algorithm checks all matching hash values in the reference file to see which is the longest match at that location. If there is a match, the longest match is encoded and the version file pointer is updated accordingly. The entire version file is processed in this fashion. The greedy algorithm runs in quadratic-time and linear-space in the worst case. However in highly correlated data, the greedy algorithm shows almost linear behavior[7]. Moreover, it can be shown that the greedy algorithm gives the optimal encoding when the block size is less than or equal to 2. If the block size is greater than 2, the greedy algorithm does not find the optimal delta encoding since it does not find matching substrings of length equal to 2 (or any length less than the block size).

The vcdiff algorithm[5], developed by Tichy, Korn and Vo, combines the string matching technique of the Lempel-Ziv '77[8] and block-move technique of Tichy[9]. The vcdiff algorithm uses the reference file as part of the dictionary to compress the version file. Both Lempel-Ziv algorithm and the block-move algorithm of Tichy run in linear time. vcdiff allows for string matching to be done both within the version file and between the reference and the version file. In vcdiff, a hash table is constructed for fast string matching.

In his masters thesis, Joshua MacDonald describes the xdelta algorithm and the version control system designed to utilize the xdelta algorithms[10, 6]. The xdelta algorithm is a linear-time, linear-space algorithm and was designed to be as fast as possible, despite sub-optimal compressions[10]. It is an approximation of the quadratic-time linear-space greedy algorithms[1]. The xdelta algorithm works by hashing blocks of the reference file and keeping the entire hash table in memory. When there is a hash collision, the existing hash value and location are kept and the current hash value and location are thrown out. The justification for this is to favor earlier, potentially longer matches. Both hash values and locations cannot be kept if the algorithm is to run in linear time, since searching for matches among the duplicate hash values would cause the algorithm to deviate from linear time. At the end of processing the reference file, the fingerprint table is considered populated. The version file is processed by computing the first hash value on a fixed size block. If there is a match in the hash table, the validity of the match is checked by exact string matching and the match is extended as far as possible. Then the version file pointer is updated to the location immediately following the match. If there is no match, then the pointer is incremented by one. The process repeats until the end of the version file is reached. The linear-space of xdelta appears not to be detrimental in practice since the constant is quite small[10]. However, the xdelta algorithm does not find the best possible matches between the reference file and the version file since hash collisions result in new information being lost. Each subsequent hash to the same location is lost and the previous information remains in the hash table.

Ajtai et al.[7] presented four differential compression algorithms, namely the one-pass differencing algorithm, the correcting one-pass algorithm, the correcting 1.5-pass algorithm, and the correcting 1.5-pass algorithm with checkpointing. Their one-pass differencing algorithm was proven to be linear in the worst-case but produces suboptimal compression, since it neither detects transpositions in data nor finds optimal matches at a given location of the version file. Their one-pass algorithm continually processes both the original file and version file sequentially, finding matches by hashing blocks and comparing the blocks. Thus their algorithm will encode the first match it sees and then clear the hash tables. Hence all encoded matches must be in the same sequential order between the reference file and the version file to be detected.

In order to fix these shortcomings, they devised two new methods, corrections and checkpointing. Their method of corrections is a way to improve the match, yet it does not guarantee that they pick the optimal match. It involves implementing a circular queue to store previous hash values of the reference file. Thus it can also cause the existing one pass algorithm to deviate from the worst-case linear-time complexity. The 1.5-pass algorithm works by first hashing footprints in the reference file, but when there is a hash collision it stores only the first offset encountered. Next, the version file is continually processed, by hashing on blocks from the version file. If there is a valid match, then the match is encoded, the version file pointer is incremented and the process continues. The method of checkpointing is used when all possible hash values cannot fit into memory and a subset of these hash values must be selected as an accurate representation of the file. Thus checkpointing implemented along with corrections allows the existing algorithm to improve upon matching substrings already found. This modified algorithm can find longer matches. The work of Ajtai et al. is currently used in IBM's Tivoli Storage Manager product.

There have also been differential compression methods based solely on suffix trees. Weiner[11] proposed a greedy algorithm based on suffix trees that solves the delta encoding problem using linear-time and linear-space. Unlike xdelta, the constant factor of this algorithm is quite large and prevents it from being used on very large files.

More recently, Shapira and Storer presented a differential compression algorithm that works in-place and uses the sliding window method[13]. They showed empirically that the sliding window method effectively tackles the differential compression problem. Their algorithm uses O(max(n, m))+ O(1) space where m is the size of the reference file and n is the size of the version file. The O(1) factor comes from the amount of space needed to store the program and a fixed amount of loop variables, etc. They also showed empirically that the limited amount of memory does not hurt the compression performance of their algorithm.

SUMMARY OF THE INVENTION

It is accordingly an object of this invention to provide a method and computer program product for finding the longest matching substrings between a number of potentially large datasets by hashing sections of files to detect occurrences of substrings and building suffix arrays to find the longest matches. The datasets may include gene sequences, web pages, and email files.

In an exemplary embodiment, the method is employed for differential file compression, and calculates hash values for blocks of at least one reference file and stores them in a hash value array, then computes a suffix array on the block hash values. The invention then processes at least one version file by starting at zero offset and calculating hash values at every offset until all matches are found, and then returns the best match. The suffix array is a set of indices in the hash value array such that the hash substring starting at an index given early in the suffix array is lexicographically lower than a hash substring starting at an index given later in the array. The method finds the best matches for every offset of a version file over a certain length threshold and for a given granularity.

If the block size is fixed, the invention's performance approximates that of the greedy algorithm, but with better memory and execution time requirements. If the block size varies linearly with the reference file size, the invention compresses very large files in linear time and constant memory space. The invention uses specific data structures to reduce the cost of searching the hash value array. Specifically, the data structures include a quick index array enabling an early exit from a search if a particular hash value is not present in a particular hash table. The quick index array is formed during a single pass on the suffix array by extracting the first t bits of the hash value of each value in the suffix array to index the location in the quick index array and placing a 1 bit in that location.

The invention also uses a block hash table, wherein reference file hash values are organized for efficient matching. Even locations in the block hash table contain the hash values in the same order that they appear in the suffix array. Block hash table values include one bit to denote whether an entry is unique or a duplicate, and the remaining bits denote an address in a reference file. If the hash value is unique then odd locations contain its location in the hash value array; otherwise if the hash value is not unique then the first odd location contains a count of the number of occurrences of the hash value in the suffix array. The invention also uses a pointer array, which is an array of indexes to the block hash table.

The method can discriminate between two matches which have the same number of full blocks but different size fractional blocks on either side of the match by identifying all matches that match to a given depth d and then looking at one additional block at both ends of the match to find the longest overall match. In another optional improvement, only matches that are at least two blocks long are considered, to enhance I/O performance.

The foregoing objects are believed to be satisfied by the exemplary embodiment of the present invention as described below.

DETAILED DESCRIPTION OF THE INVENTION

The present invention is a differential compression method that finds the optimal matches between a reference file and a version file at the granularity of a certain block size. The invention is an approximation to the greedy algorithm for differential compression or a linear-time constant-space differential compression technique that is scalable to very large files, depending on how granularity (or block size) is defined. The invention operates in linear-time and constant-space when the block size is increased proportional to the reference file size. Previous differential compression algorithms used hashing on blocks of fixed width or a sliding window method or suffix trees or LZ'77 with block move. The present invention combines hashing on blocks of a fixed width with suffix arrays, a data structure similar to suffix trees that requires less space. Unlike previous algorithms that hash on blocks, the invention finds the best match at every offset of the version file encountered. The invention also includes three new data structures that significantly reduce the cost of matching version file hash values against reference file hash values.

The present invention was also devised to serve as a pattern matching tool for web crawling, and to reduce the amount of space occupied by each user's email. There is a great deal of repetition in email exchanges when individuals reply with history information. The invention is also likely to be used in data backup applications and as a general string matching technique for web crawling and computational biology (e.g. gene sequencing).

Notation m is the length of the reference file n is the length of the version file p is the width of each block L is the number of blocks in the reference file, L=m/p H(x) is the value of the hash function for a block of data that starts at location x and ends at location x+p−1 lcp(x, y) is the longest common prefix of two substrings x and y s is the number of bits to index the pointer array, note that $s=\lceil \log_2 L \rceil -2$ t is the number of bits to index the quick index array, note that $t=\lceil \log_2 L \rceil +5$ Some pointers necessary to describe the invention via pseudocode are now described:

$v_c$ is the position of a pointer in the version file $v_{temp}$ is a temporary pointer to the version file $r_c$ is the position of a pointer in the reference file $v_{prev}$ is the pointer to the version file used to denote the end of the previous encoded match.

The invention hashes on blocks of the reference and version file. The hash value is an abbreviated representation of a block or substring. It is possible for two different blocks to hash to the same value giving a spurious match. Thus if the hash values match, the invention must still check the blocks using exact string matching to ensure that it has a valid match. Thus hash values do not uniquely define a block, but if two blocks have different hash values, the two blocks do not match. The invention uses the Rabins-Karp hash method[14] because it evidently gives the least amount of collisions in most situations and it is efficient to compute for a sliding window. Furthermore, the invention hashes modulo a Mersenne prime, $2^{31}-1$. A Mersenne prime allows hash values to be computed very efficiently. All hash values in the invention are 31 bit numbers stored in a 32-bit (4-byte) unsigned long integer. Typically the number of blocks in the reference file is much smaller compared to $2^{31}-1$. Thus only a small subset of all possible hash values is present in the reference file. This reduces the probability of a spurious match, when two unequal blocks hash to the same value.

The invention takes advantage of the suffix array data structure introduced by Manber and Myers[12]. The suffix array is a data structure that can be used for online string matching, yet requires three to five times less space than a suffix tree. The suffix array construction is detailed in Appendix A.

The invention must also choose a block size (or seed length [7]). The block size is a very important parameter because it determines the granularity of the matches to be detected as well as the length of the shortest match detected by the invention. It also governs the amount of memory needed for the invention, which is inversely proportional to the block size.

The invention first processes the reference file to produce a complete hash table that is stored in memory as the hash value array, which is an array of L 4-byte values. Next, the invention creates a suffix array of hash values. The size of the suffix array is 2·L, where L is the number of hash values. The suffix array is described in detail in Appendix A. The invention also creates three data structures that allow for easy searching into the hash value array. These data structures are described in more detail below. Next the invention processes the version file by starting at offset zero and computing the hash value at every offset until it finds a match. If a match is found, the invention picks the longest match with an error of approximately a block length. In order to ensure the invention has the best match, it keeps track of the best seen match of the version file until it is done hashing on every offset of that block. When the invention comes across a better match, it replaces the match. This procedure ensures that all possible relative alignments between the two files are examined. The invention increments the pointer to the location immediately following the match and continues the same process until the entire reference file has been processed.

Important Data Structures

The invention employs three data structures that substantially improve its running time but do not affect its complexity. The construction time of these data structures is fairly small. The three data structures are the quick index array, the block hash table, and the pointer array. These three data structures are crated in one pass of the suffix array constructed by methods described in Appendix A. The suffix array allows for quick searching, and is essentially a set of indices in the hash value array such that the hash substring starting at an index given early in the suffix array is lexicographically lower than a hash substring starting at an index given later in the array.

The purpose of the quick index array is to serve as an early exit mechanism if a hash value is not present in the hash table. The quick index array is desired because there are $2^{31}$ possible hash values given the prime number used in the hash computation. The number of distinct hash values is always less than the number of blocks, or L, which is typically less than $2^{20}$. The hash table is about 0.05% populated, thus it is advantageous to design data structures that take advantage of the sparsity of the hash table. The size of the quick index array can be described as a tradeoff between storage and the efficiency of an early exit scheme. The quick index array is an array of bits that contains $2^t$ bits or $2^{t-3}$ bytes. The quick index array is initialized to contain all 0s and is formed by a single pass on the suffix array. For each hash value in the suffix array, the invention extracts the first t bits of the hash value. The first t bits of the hash value are used to index the location in the quick index array and place a 1 in that bit location. Thus if a hash value is present in the suffix array (and thus the hash value array), there will be a 1 present in the location indexed by the first t bits of the hash value. If a hash value is not present in the suffix array, there could be either a 1 or 0 in the location indexed by the first t bits of the hash value depending on whether there is another hash value with the same leading t bits. The number of bits to use was selected by the following reasoning: There are at most L different hash values, thus at most L of the $2^t$ bits in the hash table are 1. Thus for a random hash value which is not present in the hash value array, the probability of finding a 1 in the quick index array is less than $2^{-5}$. Since the invention makes only one pass on the suffix array, the data structure takes O(L) time to construct where L again is the number of hash values in the hash array.

Figure 2:
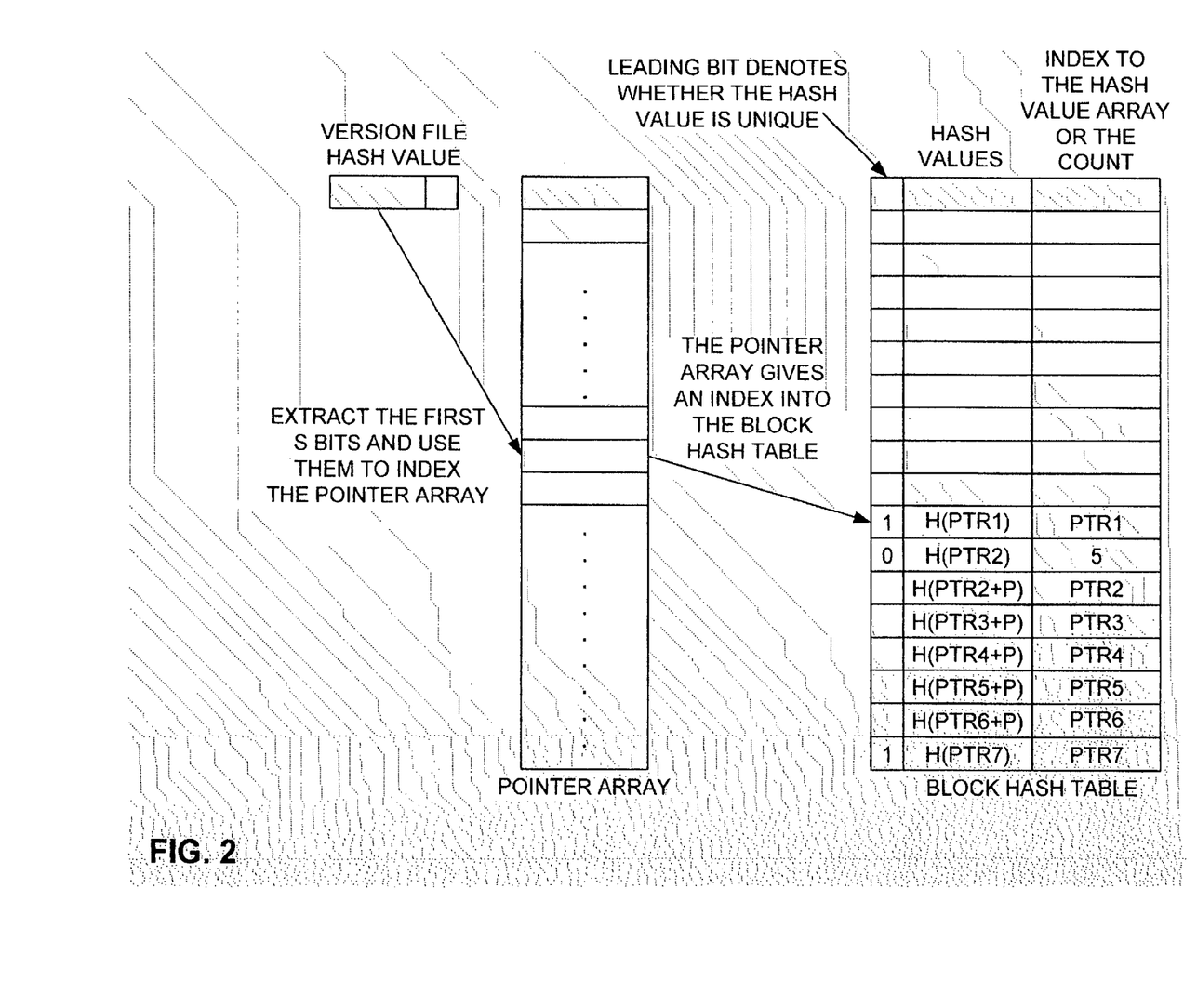
FIG. 2 is a diagram of the block hash table depicting how unique and duplicate hash values are represented, according to an embodiment of the invention.

Referring now to FIG. 2, unique and duplicate hash values are represented in the second data structure shown,. which is the block hash table. The invention organizes the reference file hash values for efficient matching in the block hash table. The block hash table is implemented as an array. The even locations contain the hash values in the same order that they appear in the suffix array. Distinction between unique hash values and hash values that are replicated is desired since the invention needs to determine if it should perform a binary search to find the longest match. Since the hash values are 31 bits, a free bit is available for use to distinguish between unique hash values and duplicate hash values. The leading bit is a 1 if the hash value is unique and a 0 if the hash value is not unique. The remaining 31 bits contain the hash value, H(r), where r is a pointer in the reference file. If the hash value H(r) is unique, the odd locations contain its location in the hash value array. If the hash value H(r) is not unique, the first odd location contains the count or the total number of occurrences of this hash value in the suffix array. The first pair after the hash value and count represents the lowest ranked substring that starts with H(r) and the last pair represents the highest ranked substring that starts with H(r). All of the substrings are ordered, as they are in the suffix array since the block hash table was created by a single pass of the suffix array. Thus every hash substring starting with H(r) is in its lexicographic order. Each pair consists of a pointer to the hash value array in the odd locations and the corresponding even positions contain the hash value corresponding to the next block after the pointer. This provides immediate access to hash values for two block matches without accessing the hash value array. For longer matches, accessing the hash value array is necessary.

The final data structure is the pointer array, which is an array of indices to the block hash table. The pointer array is indexed by the first s, or $\lceil \log_2 L \rceil - 2$ bits of the hash value. This location contains a pointer to the smallest reference file hash value with the same leading s bits. Thus the pointer array reduces the number of hash values that must be processed to determine if a match exists. The number of bits to use was selected by the following reasoning: There are at most L different hash values in the hash table, and if the invention uses s bits, each pointer in the pointer array, on average, will map to approximately four hash values in the block hash table, assuming the hash function is good.

Figure 3:
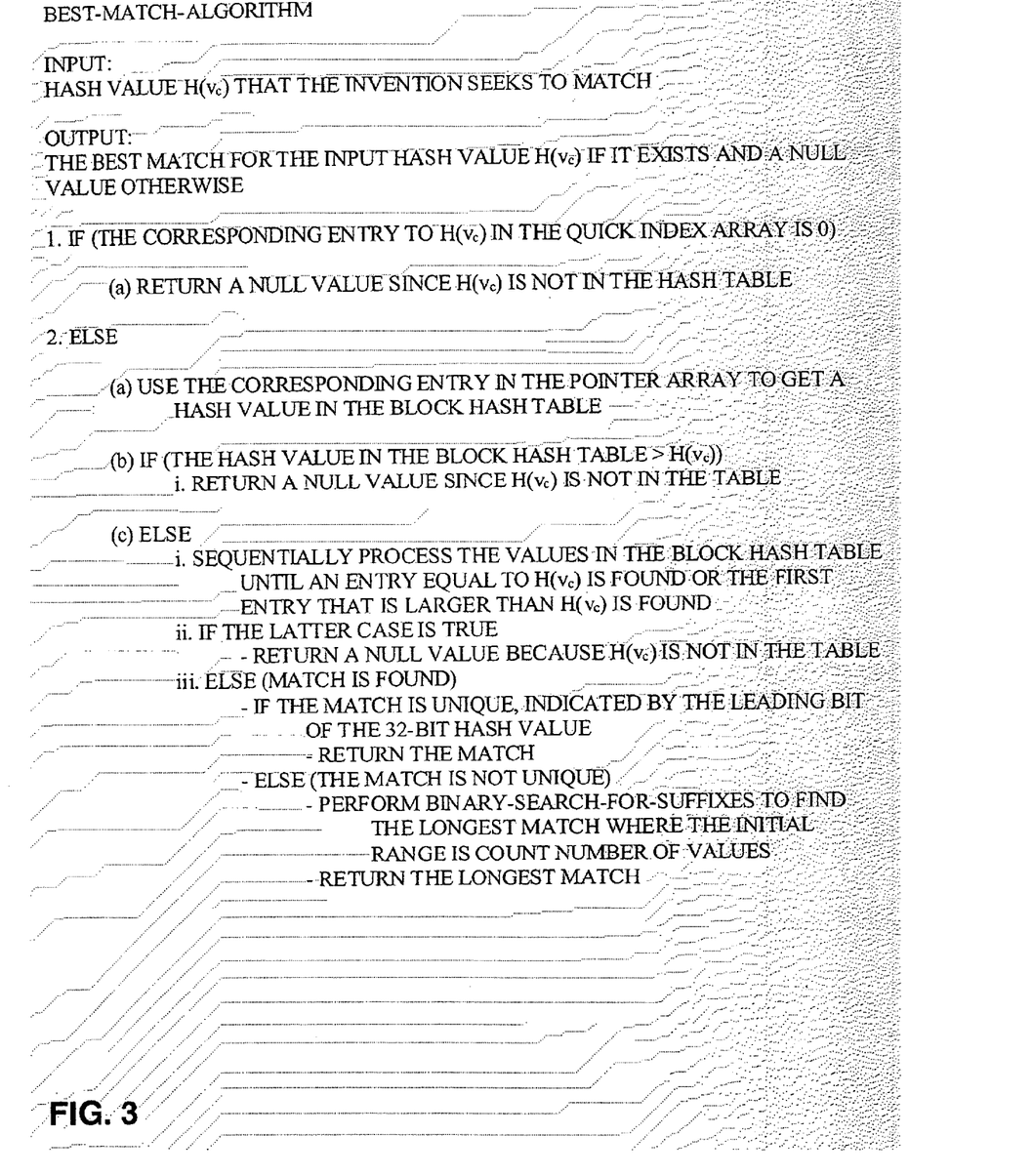
FIG. 3 is a pseudocode matching algorithm employed by the invention, according to an embodiment of the invention.

Referring now to FIG. 3, the matching algorithm is shown. The three data structures are used for efficient matching between the version file hash values and the reference file hash values. The matching works as follows: After each hash value computation in the version file, the invention extracts the first t bits and checks the quick index array. If it is a 0, there is no match in the hash value array and the invention quits. If it is a 1, the invention checks the pointer array. The first s bits of the version file hash value serve as an index in the block hash table. If the hash value that the index points to in the block hash table is greater than the version file hash value, then the version file hash value is not in block hash table and the invention exits since there is no match. If the hash value that the index points to in the block hash table is equal to the version file hash value, then the invention checks to see if the match is unique. If the match is unique, then the invention returns the match. If the match is not unique, then the invention performs a binary search to see which of the matches provides the longest match. The nature of the suffix array allows the invention to do binary searching since the hash substrings with the most number of block matches are grouped together. After the invention has found the longest match, it returns it. If the hash value that the pointer array points to is less than the current hash value then the invention sequentially traverses other hash values in the array to see if there is a match. If the hash values that are processed sequentially are repeated hash values, the invention uses the count in the odd entries to skip over the next count pair of values. As mentioned earlier there are approximately four hash values mapped to one pointer, thus the sequential processing of hash values is not a time consuming step. Also if there are repeated hash values, this does not affect the complexity of the sequential processing of hash values since the count value allows the invention to skip over the repeated hash values. If the invention encounters a hash value that is larger than the desired hash value, while processing the block hash table sequentially, the invention quits. If the invention encounters a match, then the invention follows the same matching procedure as described above. The quick index array, the pointer array, and block hash table substantially reduce the amount of time spent searching for the desired hash substring. In the absence of these data structures, one would have to perform binary search on the entire suffix array, which contains L values, for all version hash values generated.

To summarize, FIG. 2 shows that the invention accesses a value in the pointer array using the first s bits of the version file hash value. This value provides an index to the block hash table. A few example entries are shown in the block hash table. Duplicate hash values are shown with a 0 in the first bit and unique hash values are shown with a 1 in the first bit. Also notice that when there are duplicate hash values, the initial pair of values contain the hash value along with the number of occurrences (called the count) of the hash value. The next pair of values contain pointers to the hash value in the hash value array in the odd positions and the hash value of the subsequent block in the hash value array in the even positions. Note that in this diagram, ptr1-ptr7 are indices of the hash value array. In this example, the hash value string at ptr2 is the lexicographically lowest string starting with H(ptr2) and the hash value string at ptr6 is the lexicographically highest string starting with H(ptr2).

Algorithm Pseudocode

Figure 4:
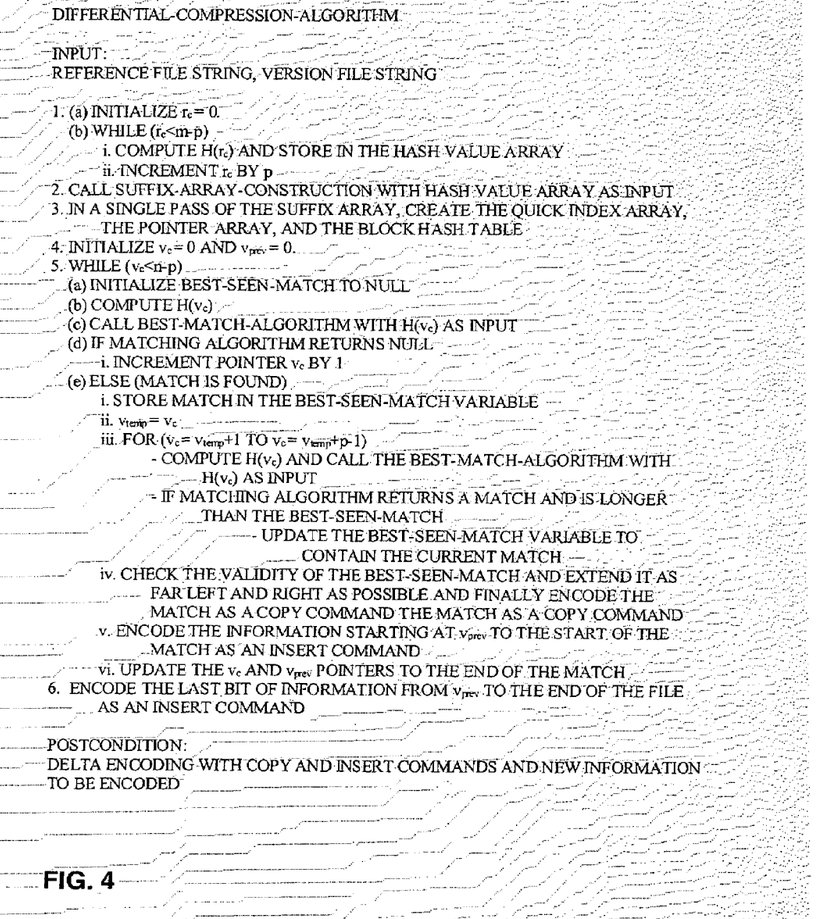
FIG. 4 is a pseudocode differential compression method, according to an embodiment of the invention.

Referring now to FIG. 4, the main differential compression methodology is shown. The specific binary search method used on the suffixes in the block hash table is given in FIG. 5. This binary search method is a modification of the conventional binary search method. The invention maintains a lowRankPtr and a highRankPtr which are pointers that index the block hash table. In the example given in FIG. 2, initially the lowRankPtr is set to the row containing ptr2 and the highRankPtr is set to the row containing ptr6.

Figure 5:
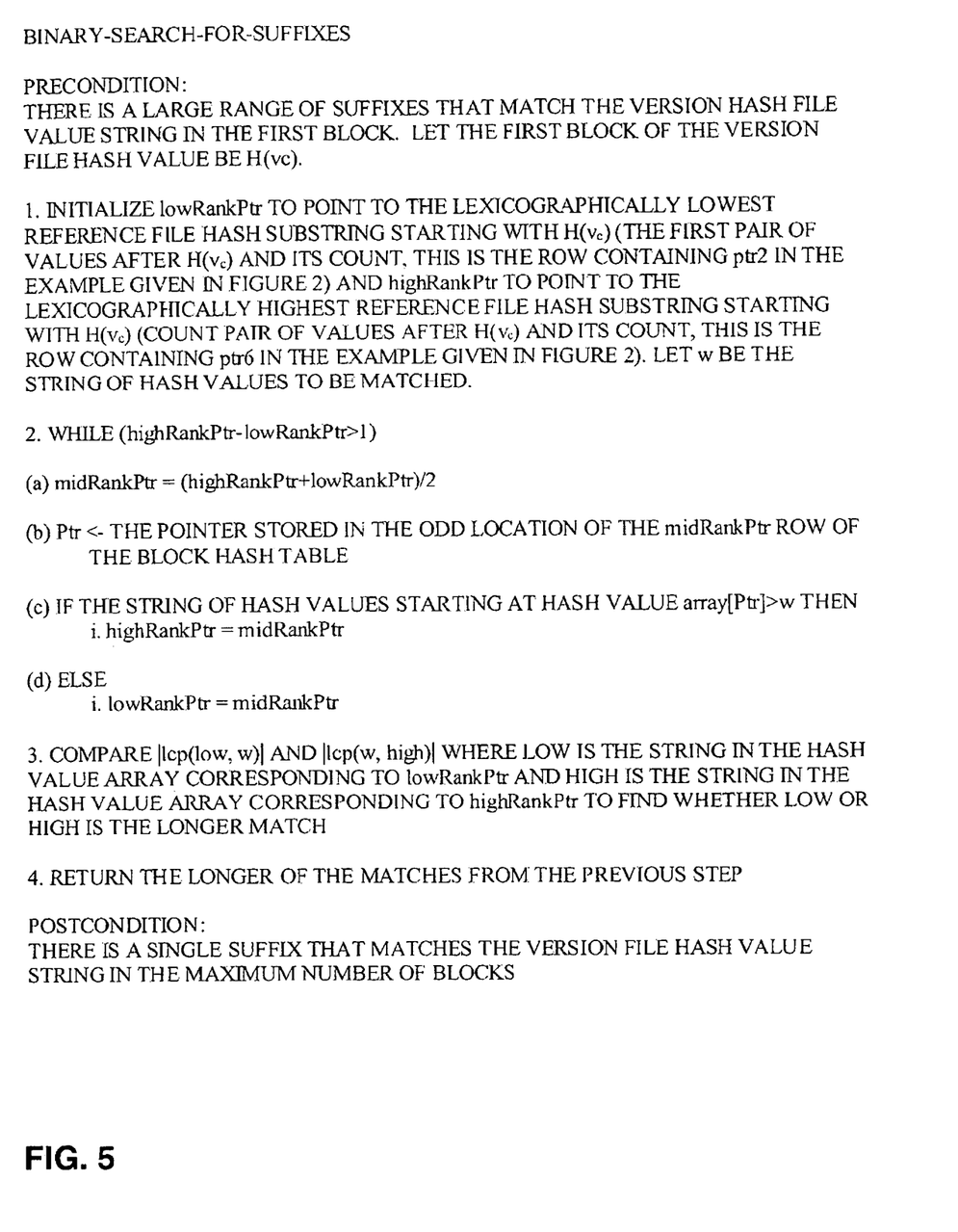
FIG. 5 is a pseudocode binary search method used on the suffixes in the block hash table, according to an embodiment of the invention.

The amount of hash value comparisons in the binary search method can be reduced by keeping track of min(|lcp(low, w)|, |lcp(w, high)|, where low is the string in the hash value array corresponding to lowRankPtr and high is the string in the hash value array corresponding to highRankPtr. This binary search method exploits a property of suffix arrays that when searching for a particular string w in a suffix array, if the length of the longest common prefix is x blocks in length, all suffixes that match w to x blocks will be adjacent to each other in the array.

Time and Space Analysis

Block size selection determines whether the invention is a linear-time constant-space method or an approximation to the greedy algorithm that requires less space and time.

The main data structures in the differential compression technique that require space proportional to the number of blocks in the reference file are the hash value array, the suffix array, the rank array in the suffix array construction routine, the quick index array, the pointer array, and the block hash table. The block hash table is created in place using the space occupied by the suffix array and the rank array. The hash value array contains L hash values, each a four-byte value. The suffix array contains L indices in the odd locations and L hash values in the even locations, each a four-byte value. The quick index array contains $2^{(\lceil \log_2 L \rceil + 5)}$ bits or $2^{(\lceil \log_2 L \rceil + 2)}$ bytes and the pointer array contains $2^{(\lceil \log_2 L \rceil - 2)}$ entries or $2^{(\lceil \log_2 L \rceil)}$ bytes. The block hash table contains 2·L entries if all the hash values are unique. When the hash values are not unique, the block hash table contains at most 3·L values. This happens when all hash values occur exactly twice. In this situation, there is one row indicating the count, followed by the two rows corresponding to the hash values. The rank array in the suffix array construction routine contains L indices, each of which is a four-byte value. All other variables and arrays require O(1) space. The present invention is structured such that the block hash table shares memory with the suffix array and the rank array. Thus, the worst case memory requirement is only 26·L bytes. The space requirements of the method are summarized in Table 1. Note that the space requirements for the block hash table are not included in the total since it uses the space of existing data structures.

TABLE 1

| Data Structure | Space (in bytes) |
| --- | --- |
| hash value array | 4 L |
| suffix array | 8 L |
| rank array | 4 L |
| quick index array | 4 L to 8 L |
| pointer array | L to 2 L |
| block hash table | 8 L to 12 L |
| Total | 21 L to 26 L |

The space requirements for the greedy algorithm are simply the hash table. However, since the greedy algorithm hashes on every offset of the reference file, there are n−p+1 hash values in the hash table. The space requirements for the greedy algorithm are approximately 3·n, since the greedy algorithm as implemented by Ajtai et al.[7] uses a 3-byte hash value. Hence, if block size is chosen to be greater than 9 bytes (which is typical in practice), the present invention requires less space than the greedy algorithm. Note that if block size p is increased, as the reference file size increases, then the invention requires constant space, because L will be constant. In this situation, however, the greedy algorithm is still a linear space algorithm.

A simplified version of the invention is considered when performing a time analysis. Rather than using the quick index array, the pointer array, and the block hash table in the time analysis, consider only matching to be done as binary search on the entire suffix array. This is reasonable since the quick index array, pointer array, and block hash table are simply implemented to make the matching process more efficient. Hence the full invention performs at least as well as the simplified version of the invention. However, the creation of these data structures is included in the complexity analysis of the invention. Another assumption is that there are no spurious multi-block matches, i.e. instances where two or more consecutive hash values match, but the block themselves do not match. This is reasonable since the probability of having a spurious multi-block match is very low.

During the time analysis, although a simplified model of the differential compression technique is being considered, the steps in FIG. 4 remain the same. However the matching algorithm described in FIG. 3 is simplified to binary search on the entire suffix array. The single pass of the reference file and the hash computation in Step 1 of FIG. 4 requires O(m) time, since the hash computation requires use of every byte in the reference file. The creation of the suffix array as described in Appendix A requires O(L logL) time. The single pass of the suffix array to create the quick index array, the pointer array, and the block hash table require O(L) time. Consider Step 5 of FIG. 4, processing of the version file. In Step 5(b), one could compute hash values at every offset of the version file. Computing hash values on every offset of the version file has complexity O(n). This argument relies on a property of the Karp-Rabin hash computation[14] which requires O(1) computation on H(x) to produce H(x+1). The binary search routine described in FIG. 5, used in the processing of the version file, has complexity O(d+logL), where d is the depth of the longest match in terms of blocks, as shown in the work of Manber and Myers[12].

Now consider two separate cases. The first case is Step 5(d) in FIG. 4, where there is no match to the hash value of a version file offset. In this case the depth is 0 so d=0. Thus for each version file offset for which there is no match, the complexity is simply the cost of performing binary search or O(logL). In the case that there is a match (Step 5(e) of FIG. 4), check the matches corresponding to the next p−1 offsets or in other words, perform binary search for the hash value generated for each version file offset in this block. This is Step 5(e)iii. of FIG. 4. Since binary search is required, for each offset within a block, the complexity is O(p·($d_{max}$+logL)), where $d_{max}$ is the largest value of d for any offset in the entire block. This results in a match of size p$d_{max}$ bytes. Amortized per byte of the match, the complexity is O((p·$d_{max}$+plogL)/p·$d_{max}$) or O(1+((logL)/$d_{max}$)). Since $d_{max}$ is at least 1, this is bounded by O(1+logL) or O(logL). Thus the worst-case complexity of processing the version file amortized to each byte, regardless of if there is a match or not, is O(logL). Hence processing the entire version file takes O(nlogL). The time requirements of the invention are summarized in Table 2.

TABLE 2

| Step | Complexity |
| --- | --- |
| hashing on reference file | O(m) |
| suffix array construction | O(L logL) |
| creation of data structures | O(L) |
| hashing on the version file | O(n) |
| processing the version file | O(n logL) |
| Total | O(m + L logL + n logL) |

The total complexity of the method is O(m+L logL+n+ nlogL) which can be reduced to simply O(m+L logL+nlogL). This can also be written as O(m+(m/p)log(m/p)+nlog(m/p)). If p remains constant as m increases, the complexity can be simplified to O(m+mlogm+nlogm) or just O((m+n)logm). When the invention is considered as an approximation to the greedy algorithm by fixing the block size, it clearly has a better asymptotic complexity than the greedy algorithm with similar compression performance. In the case where p increases proportionally with m, m/p or L is a constant. Thus the complexity reduces to O(m+n). Thus if p is increased proportionally with m, that is fix L, the invention operates as a linear-time constant-space method.

However in practice, much better running time is observed than the asymptotic complexity derived above because of the creation of the quick index array, the pointer array, and the block hash table, which narrow the scope of the binary search and the matching procedure.

Performance Compared to the Greedy Algorithm

The compression performance of the invention is equivalent to the performance of greedy algorithm for the following reasons. In the greedy algorithm, hash values are computed on the reference string for all offsets. Thus it can find matching substrings which are at least one block long. The present invention computes hash values only on the block boundaries of the reference file. Thus, the invention will miss matches which are longer than a block but do not contain a full reference block, i.e. if the common substring straddles two blocks. This is because there is no single reference file hash value that represents the information in this match. However, finding any match that is at least two blocks long is assured, because, in this case, the match contains at least one complete block of the reference file, for which the invention has computed the hash value. Thus, results equivalent to the greedy algorithm are obtained if the block size is chosen to be half of the block size used by the greedy algorithm. The greedy algorithm as described by Ajtai et al. requires storing n−p+1 hash values (approximately n hash values) where n is the length of the reference string. The invention requires using only (2·n)/p hash values where p is the block size used by the greedy algorithm. In this step, the invention reduced the space requirement by approximately p/2 without giving up any capability in finding small matches.

When there are multiple matches for a given offset of the version file, the greedy algorithm performs an exhaustive search to find the best match. This is very expensive if hash collisions are frequent. The present invention performs binary search as described in FIG. 5 to find the best match with the granularity of a block size. The invention cannot discriminate between two matches which have same number of full blocks but different size fractional blocks on either side of the match. Other than this flaw, the invention is more efficient than the greedy algorithm.

The flaw can be gotten around by modifying the invention as follows: After binary search the invention concludes that the longest matching substrings match to a depth of d blocks. One should consider all matches that match at a depth of d blocks as well as those that match at a depth of d−1 blocks. For all these hash substrings, look at one block at both ends of the string to find the longest overall match. This is still much more efficient than the greedy algorithm since the invention has narrowed down the number of matches where it performs full string matching. For example, consider the scenario where there are 100 matches having the same hash values and only four matches which match at a depth of 9 or 10 blocks. The greedy algorithm will examine all 100 matches and each of these examinations may be potentially up to 10 blocks long. The invention looks at only four longest matches and for each of these matches, only one block on either side needs to be examined. Note that the invention needs to examine the hash substrings that match at a depth of d−1 since the match may be extended to an additional fractional block on either side to give a match which is longer than d blocks. In other words, with the scenario given above, it is possible that the matches at a depth of 10 match in a length of exactly 10 blocks and a match at a depth of 9 matches at a depth of almost 11 complete blocks, since the strings could match up to an additional block on either side of the match. However, one would not know this until one actually examines the matches. Thus it is necessary to explore not only the matches that match in the longest depth, but the matches that match in the longest depth minus 1.

Experimental Results

The present invention was compared with xdelta, vcdiff, the halfpass algorithm of Ajtai et al., and the greedy algorithm implemented by Ajtai et al. on a data set of files ranging in size 78 KB to 55 MB. Experiments were conducted on block size to see which block size provides the best compression.

Figure 8:
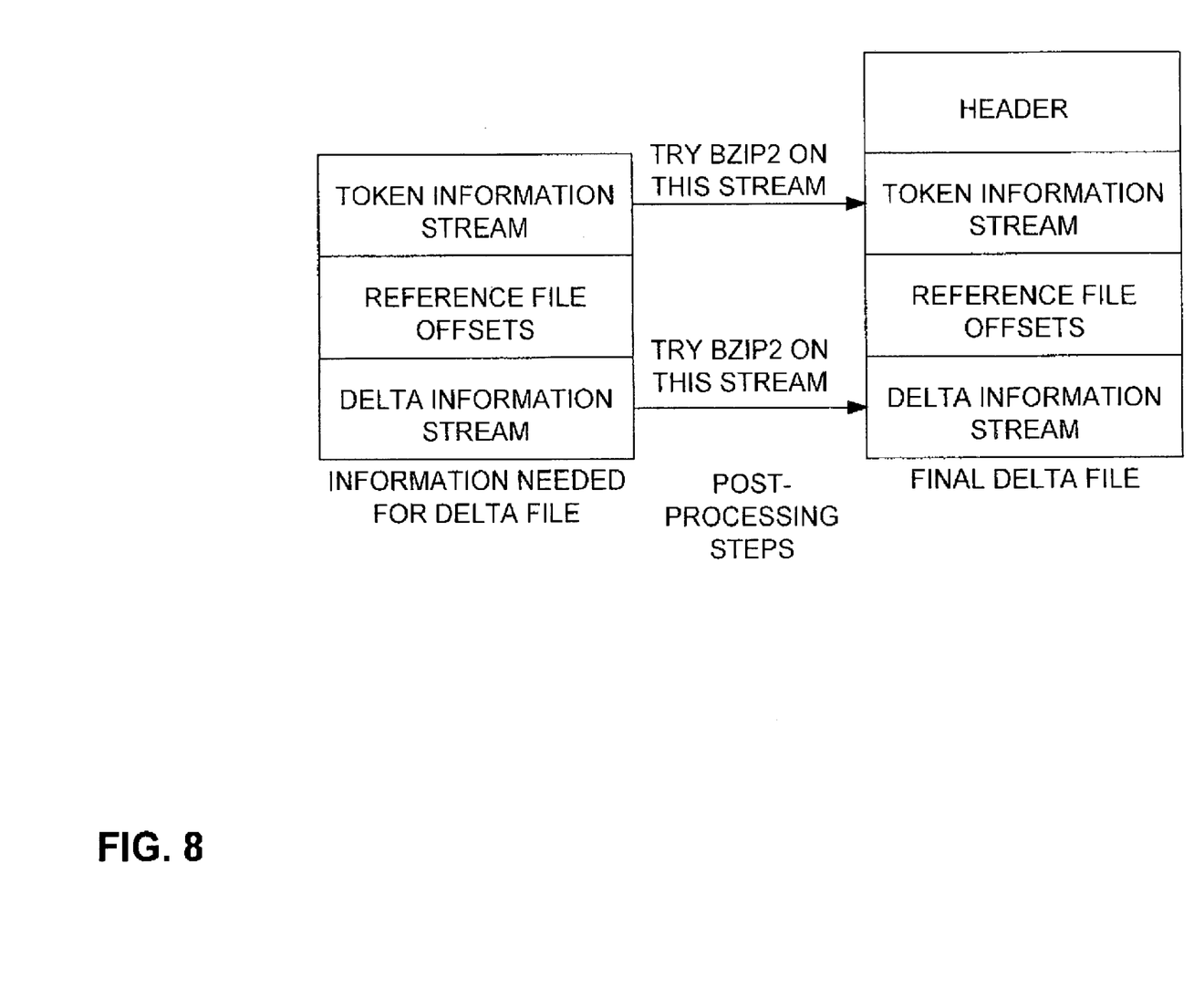
FIG. 8 is a diagram of an encoding scheme, according to an embodiment of the invention.

Referring now to FIG. 8, the invention uses bzip2 on token streams to provide additional compression. For standardization purposes, bzip2 was implemented on the output of xdelta, vcdiff, the halfpass algorithm of Ajtai et al., and the greedy algorithm. Since the invention quits-if bzip2 does not compress the delta file or the first 1 MB of the delta file, a similar measure was implemented with the other algorithms. If bzip2 did not compress the delta file with respect to the other algorithms, the time taken for bzip2 was not included in the results. If bzip2 did indeed compress the delta file, the time taken for bzip2 was included in the results. It was observed that when the block size was made higher, bzip2 does indeed compress the delta file. If block size is made higher, the invention will find the larger matches between the reference file and version file and bzip2 will find the smaller matches within the version file. A block size of 12 was used when the reference file is smaller than 1 MB and a block size of 24 was used when the reference file is larger than 1 MB.

Two types of data were used for experimentation. The first type of data is synthetically created data and the second type of data is various versioned software. The synthetically created data was created by taking an existing binary file and then performing a series of operations on it to obtain a version file. There are four possible operations, including inserting new information, deleting existing information, copying an existing substring and insert it into a new location, and moving an existing substring from one location to another. Typically, for an original file, part of it was used as the reference file and then the rest of it as the source for the insert operations. For the second type of data, the versioned software, different versions of gcc, gnusql server, linux files, netscape files, and samba files were used.

Empirical evidence indicates the invention provides better compression than xdelta, vcdiff, and the code of Ajtai et al. in most cases. The speed of the invention is also competitive with xdelta, vcdiff, and the code of Ajtai et al. On the whole, the invention is somewhat slower compared to xdelta but significantly faster compared to vcdiff and the code of Ajtai et al. The invention is competitive with the greedy algorithm implemented by Ajtai et al. both empirically and theoretically, without the expensive space and time requirements. In most cases, the invention provides slightly better compression compared to the greedy algorithm. This is perhaps due to the encoding scheme (described in Appendix B).

Appendix A: Suffix Array Construction

The invention employs a suffix array construction algorithm similar to that of Manber and Myers[12]. The suffix array construction is the process by which the invention forms a suffix array of the hash values computed on the reference string. The initial array of hash values is called the hash value array.

A.1 Sorting Algorithm

Before describing the suffix array construction algorithm, it is necessary to describe the sorting algorithm used as a part of the suffix array construction algorithm. Since the hash values are four byte values, the hash values can be sorted in linear time by making five passes over the array of hash values. This sorting procedure is called four-byte integer-sort.

The four-byte integer-sort routine requires three data structures, namely a primary array, a work array, and four count arrays. The invention starts out with an array that called the primary array. It contains 2·L total values, where L is the number of hash values computed on the reference file and each value is four bytes. In the odd locations the invention stores the index of each hash value in the hash value array and in the even locations stores the hash values themselves. The invention requires 4 count arrays, one for each byte position, where each array contains 256 values to store the number of occurrences for each possible byte value. The invention also has a work array that will contain 2·L values much like the primary array but is uninitialized at the beginning of four-byte integer-sort. The sorting procedure is described in FIG. 6.

Since four-byte integer-sort requires five passes on the array, its time complexity is 5 times the size of the array plus a constant amount of time required to allocate the data structures used. It requires space of 2 times the size of the array plus the size of the count arrays, which is 4×256 integers or 4096 bytes. Note that the four-byte integer-sort routine is an order-preserving sort algorithm. This is a necessary feature for the construction of suffix arrays.

Theorem A.1 At the (n+1)th pass of four-byte integer-sort, the data is sorted by the lowest order n bytes.

Proof: This fact is proven by induction.

Base case: Note that the first pass is used to count the occurrence of various byte values. On the second pass of four-byte integer-sort, the values are placed in buckets based on their lowest order byte. The count array tells how big each bucket needs to be starting with the smallest byte to the largest byte. Thus, the values are sorted on their lowest order byte.

Inductive step: Now assume that on the nth pass of four-byte integer-sort, the data is sorted by the lowest order n−1 bytes. Now consider the (n+1)th pass of the algorithm and consider two hash values in the array, ci and cj. Without loss of generality, let $c_i \leq_n C_j$, where $\leq n$ respects ordering only to the last n bytes. First consider the two cases where $c_i$ and $c_j$ are not equal. Some notation: let $c_i[n]$ be the nth order byte of $c_i$.

Case 1: $c_i[n]=c_j[n] \rightarrow c_i <_{n-1} c_j$. Thus after the nth pass, $c_i$ appears before $c_j$ in the partially sorted array. In the (n+1)th pass of the algorithm $c_i$ and cj are to be placed in the same bucket. However, in the (n+1)th pass of the algorithm, $c_i$ is encountered before $c_j$ and it is placed in the bucket before $c_j$. Thus $c_i$ appears before $c_j$ after the (n+1)th pass is complete.

Case 2: $c_i[n]<c_j[n]$. This means on the (n+1)th pass, $c_i$ is to be placed in a bucket of smaller value than $c_j$. Thus $c_i$ appears before $c_j$ after the (n+1)th pass is complete.

Case 3: Now consider the case where $c_i =_n c_j$. The (n+1)th pass of the algorithm seeks to place $c_i$ and $c_j$ in the same bucket. After the nth pass of the algorithm, if there are values $c_k$ are between $c_i$ and $c_j$ in the partially sorted array, this means $c_i =_{n-1} c_k =_{n-1} c_j$ for all such $c_k$. Thus when this array is sequentially processed in the (n+1)th pass, $c_i$ is placed in the bucket corresponding to its nth byte, the $c_k$ are placed in the bucket corresponding to their nth byte, and $c_j$ is placed in the bucket corresponding to its nth byte. Hence if there are values between $c_i$ and $c_j$ after the (n+1)th pass of the algorithm, they must equal $c_i$ and $c_j$ in the lowest n order bytes.

A.2 Suffix Array Construction Algorithm

Figure 6:
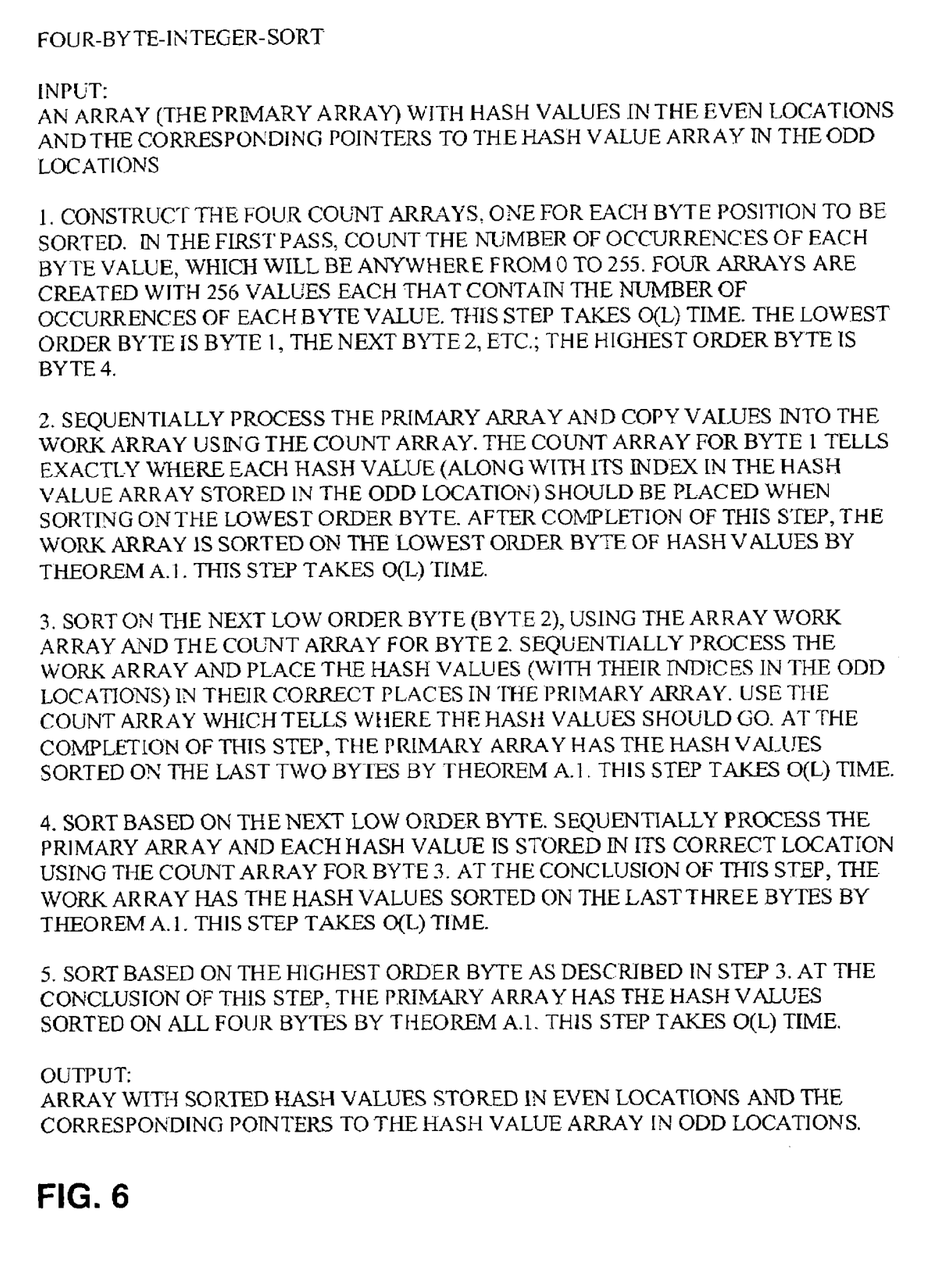
FIG. 6 is a pseudocode sorting method used during suffix array construction, according to an embodiment of the invention.

At the start of the suffix array construction algorithm, the invention calls the four-byte integer-sort routine described in FIG. 6. At the end of this process, if the hash values are distinct then the suffix array is formed. If the hash values are not distinct, for each group of duplicate hash values, the invention must look at the subsequent hash values in the hash value array, until the strings of hash values are distinct.

Figure 7:
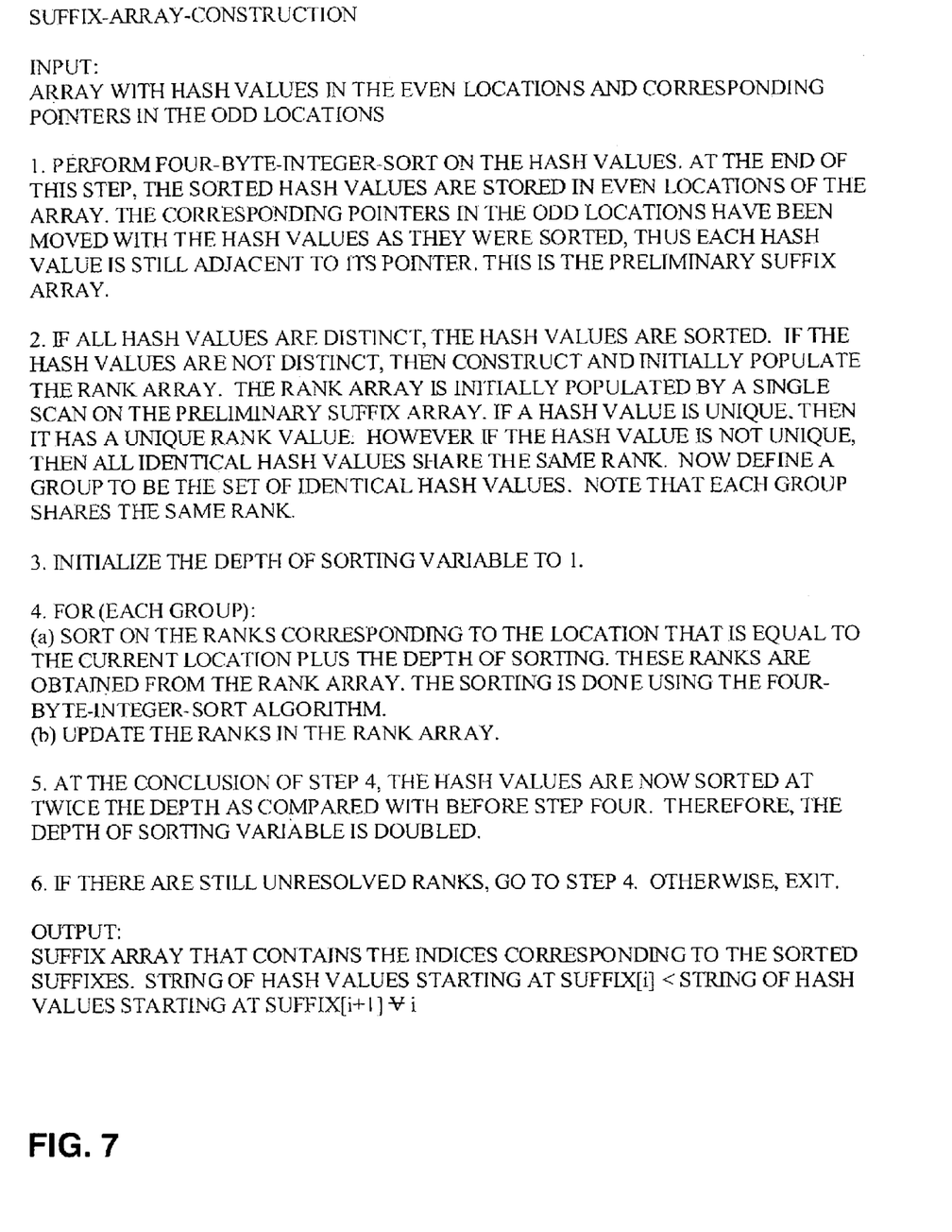
FIG. 7 is a pseudocode suffix array construction method, according to an embodiment of the invention

The invention creates a data structure called the rank array that allows it to access the suffix array position (or the rank) for any location in the hash value array. As it transforms the primary array into the suffix array of hash values, the rank array gets continually updated. Thus the invention indexes the rank array by the index of the original hash value array and the rank array value is its location in the suffix array. The suffix array construction algorithm is described in FIG. 7.

Suffix array construction terminates since no two strings are the same in the hash value array. Suffix array construction takes O(L logd) time, where L is the number of hash values (or blocks) and d is the length of the longest matching substring (in blocks) in the reference file.

Appendix B Encoding Scheme

In order to have a compact representation of the version file, an encoding scheme is developed that is not only compact but is further compressible since it preserves the byte alignment of the data. The encoding scheme is described below. First it is necessary to describe the information that must be represented in the delta file. The invention seeks to describe matching substrings between two files as tokens. There are two kinds of tokens, reference file tokens and delta file tokens. The reference file tokens must store the length of the match and the location of the start of the match in the reference file. This is equivalent to the copy command term used in other work. The delta file tokens must store the length of the new substring to be added. This is equivalent to an add command of other work. Thus there are three different streams of data, the token information stream (which provides information about whether the invention has a delta file token or a reference file token along with the length of the token), the reference file offset stream (which tells where the matching substring starts in the reference file), and the delta information (the substrings that need to be added).

The token information stream is stored as follows: The first bit denotes if the token is a delta file token or a reference file token. Then the next 6 bits contain the length. If 6 bits are not enough information to store the length of the match, then terminate the byte with a 1 in the last bit. If 6 bits are sufficient to store the length of the match, then terminate the byte with a 0 in the last bit. If the invention needs to use the next byte, the first 7 bits are used for length (which gives a total of 13 bits for length) and the last bit tells whether the next byte is used or the token has been terminated. The token terminates when the last bit of a byte is a 0. Thus the length of the token contains a certain number of complete bytes. The rationale behind this scheme is that most tokens can be represented with only one byte. In rare cases, two or more bytes are needed to represent the length. Also, it is desirable to represent tokens of small length compactly in order to maximize the reduction in space.

The reference file offset stream is stored using a fixed number of bits per token, namely $\lceil \log_2 m \rceil$, since it is the maximum possible offset value. The total length of the reference file offset stream is $\lceil k/8 \cdot \lceil \log_2 m \rceil \rceil$, where k is the number of reference file tokens. Lastly, the delta information stream contains all the new information to be added in one contiguous stream.

In order to reduce the amount of information to be stored, try using bzip2 on the token information stream and the delta information stream. If the delta information stream is over 1 MB, compress the first 1 MB and see if there is over a 5% reduction. If so, then run bzip2 on the rest of the data stream. If not, realize that running bzip2 does not help and do not continue. If the delta information stream is under 1 MB, run bzip2 on the delta information stream. Note that if the compressed stream is larger than the original stream, the invention uses the original stream for both the token information stream and the delta information stream. The reference file offset stream is generally not compressible and therefore the invention does not try to run bzip2 on it. Thus the final encoding contains four different streams, the token information stream (either compressed or not compressed using bzip2), the reference file offset stream, the delta information stream (either compressed or not compressed using bzip2), and a header. The header contains pointers to the three data streams, the number of bits used for each reference file offset value, $\lceil \log 2m \rceil$ where m is the length of the reference file, and whether or not bzip2 was used on the streams. The encoding scheme and final delta file are illustrated in FIG. 8.

Appendix C Further Optimizations and Implementation Details

There are two different implementations of this differential compression invention. In one implementation, it is assumed that both the reference file and the version file fit into memory. In the other implementation no such assumptions regarding the size of the reference file and the version file are made. If it is assumed that the reference file and the version file fit into memory, there are a number of optimizations that can be made that will improve the compression performance of the invention without changing the timing results drastically. This section describes the two optimizations performed that do not affect the overall method. Through these optimizations, the invention tries to improve the length of a given match by picking up fractions of blocks on either side of the hash value match, which is an integer number of blocks.

1. If there are only single block matches, check the first 10 matches to see which provides the longest overall match. In this case, the total size of the match is under three blocks, but it is possible that a particular match may be longer than another one if information is matched immediately on the left and right of this block.

2. Rather than extending the best seen match after examining all the offsets of a given block as described in Step 5(e)iv. of FIG. 4, check the validity of the match for each offset and then extend the match on either side in Step 5(e)iii. Since the data is all in memory, this step is not expensive. This step may give a longer match, up to two blocks longer in length. Also after the binary search, the best match for that offset is compared against the best seen match, on the basis of total length of the match.

When no assumption is made that the reference file and the version file fit into memory, the invention only considers matches if they are at least two blocks long. The rationale behind this is that it is desirable to reduce the amount of I/O performed. It is not unlikely to have a spurious match of one block between the reference file and the version file, but it is very unlikely to have a a spurious match of two consecutive blocks between the reference file and the version file. For example, if the number of blocks in the reference file is $2^{20}$, then the probability of having a one-block spurious match is $2^{-11}$. However, the probability of having a spurious match of two consecutive blocks is $2^{-22}$. Since I/O is expensive, reduction in the amount of spurious I/O is desirable.

A general purpose computer is programmed according to the inventive steps herein. The invention can also be embodied as an article of manufacture—a machine component—that is used by a digital processing apparatus to execute the present logic. This invention is realized in a critical machine component that causes a digital processing apparatus to perform the inventive method steps herein. The invention may be embodied by a computer program that is executed by a processor within a computer as a series of computer-executable instructions. These instructions may reside, for example, in RAM of a computer or on a hard drive or optical drive of the computer, or the instructions may be stored on a DASD array, magnetic tape, electronic read-only memory, or other appropriate data storage device.

While the particular METHOD AND COMPUTER PROGRAM PRODUCT FOR FINDING THE LONGEST COMMON SUBSEQUENCES BETWEEN FILES WITH APPLICATIONS TO DIFFERENTIAL COMPRESSION as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for".

What is claimed is:

1. A method for differential file compression, comprising:
calculating hash values for blocks of at least one reference file and storing them in a hash value array;
computing a suffix array on the block hash values; and
processing at least one version file by staffing at zero offset and calculating hash values at every offset until all unique matches between the hash values of the at least one reference file and the hash values of the at least one version file are found, and returning the best match,
further comprising the use of specific data structures to reduce the cost of searching the hash value array,
wherein the data structures include a block hash table, wherein reference file hash values are organized for efficient matching,
wherein block hash table values include one bit to denote whether an entry is unique or a duplicate, and the remaining bits denote an address in a reference file,
wherein if the hash value is unique then odd locations contain its location in the hash value array, else if the hash value is not unique then the first odd location contains a count of the number of occurrences of the hash value in the suffix array.

* * * * *